(12) United States Patent
Kwak et al.

(10) Patent No.: US 7,605,599 B2
(45) Date of Patent: Oct. 20, 2009

(54) ORGANIC ELECTRO LUMINESCENCE DISPLAY (OELD) TO PERFORM SHEET UNIT TEST AND TESTING METHOD USING THE OELD

(75) Inventors: Won Kyu Kwak, Seongnam-si (KR); Jin Tae Jeong, Seoul (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 198 days.

(21) Appl. No.: 11/501,033

(22) Filed: Aug. 9, 2006

(65) Prior Publication Data
US 2007/0046581 A1 Mar. 1, 2007

(30) Foreign Application Priority Data
Aug. 31, 2005 (KR) .................. 10-2005-0080994

(51) Int. Cl.
*G01R 31/00* (2006.01)
(52) U.S. Cl. .................. 324/770; 349/149
(58) Field of Classification Search .............. None
See application file for complete search history.

(56) References Cited

U.S. PATENT DOCUMENTS

| | | | |
|---|---|---|---|
| 5,053,700 A | 10/1991 | Parrish | |
| 5,608,335 A | 3/1997 | Tailliet | |
| 6,265,889 B1 * | 7/2001 | Tomita et al. | 324/765 |
| 6,639,646 B2 | 10/2003 | Lim | |
| 6,734,925 B1 * | 5/2004 | Lee et al. | 349/40 |
| 6,762,735 B2 * | 7/2004 | Koyama | 345/76 |
| 6,956,396 B2 * | 10/2005 | Lai et al. | 324/770 |
| 7,027,043 B2 * | 4/2006 | Sakaki | 345/206 |
| 2003/0067319 A1 | 4/2003 | Cho | |
| 2004/0191963 A1 | 9/2004 | Pichler | |

FOREIGN PATENT DOCUMENTS

| | | |
|---|---|---|
| EP | 1 496 495 | 1/2005 |
| JP | 2000-200053 | 7/2000 |
| JP | 2004-63407 | 2/2004 |

(Continued)

OTHER PUBLICATIONS

European Search Report for European Patent Application No. 06254542.1-1228 issued on Feb. 8, 2007.

(Continued)

*Primary Examiner*—Minh N Tang
(74) *Attorney, Agent, or Firm*—Robert E. Bushnell

(57) ABSTRACT

An Organic Electro Luminescence Display (OELD) to perform a sheet unit test includes a pixel unit including: a plurality of pixels to receive a first power supply voltage (ELVDD), a second power supply voltage (ELVSS) and scanning signals to emit light; a scan driving unit to supply the scanning signals to the pixel unit; and a test unit to test whether or not a defect in the pixel unit is present, and further includes a first wire group arranged in a first direction and having a floated end; and a second wire group arranged in a second direction and having a floated end. This allows the sheet unit test to be conducted without scribing each OELD, by supplying the power supply voltages and the signals for their tests into a plurality of the OELDs formed on a motherboard.

18 Claims, 10 Drawing Sheets

FOREIGN PATENT DOCUMENTS

| | | |
|---|---|---|
| JP | 2005-43205 | 2/2005 |
| JP | 2005-164679 | 6/2005 |
| KR | 10-2004-0028363 | 4/2004 |
| KR | 10-2005-0025513 | 3/2005 |

OTHER PUBLICATIONS

Office action from Japanese Patent Office issued in Applicant's corresponding Japanese Patent Application No. 2005-316711 dated Apr. 7, 2009 and Request for Entry of the Accompanying Office Action.

* cited by examiner

ORGANIC ELECTRO LUMINESCENCE DISPLAY (OELD) TO PERFORM SHEET UNIT TEST AND TESTING METHOD USING THE OELD

CLAIM OF PRIORITY

This application makes reference to, incorporates the same herein, and claims all benefits accruing under 35 U.S.C. § 119 from an application for ORGANIC ELECTRO LUMINESCENCE DISPLAY FOR PERFORMING SHEET UNIT TEST AND TESTING METHOD USING THE SAME earlier filed in the Korean Intellectual Property Office on 31 Aug. 2005 and there duly assigned Serial No. 10-2005-0080994.

BACKGROUND OF THE INVENTION

1. Field of the Invention

The present invention relates to an Organic Electro Luminescence Display (OELD) and a testing method using the OELD, and more particularly, to an OELD to perform a sheet unit test and a testing method using the OELD.

2. Description of the Related Art

Generally, a plurality of OELDs are formed on one motherboard, and then scribed to divide into separate OELDs. Tests on such OELDs are conducted by separately testing the OELDs whose scribing has been completed.

An OELD has a scan driving unit, a data driving unit, a data distribution unit and a pixel unit.

The scan driving unit generates scanning signals. The scanning signals generated in the scan driving unit are sequentially supplied into scanning lines.

The data driving unit generates data signals. The data signals generated in the data driving unit are sequentially supplied into output lines.

The data distribution unit supplies the data signals into at least two data lines, the data signals supplied from each output lines of the data driving unit.

The pixel unit is composed of a plurality of pixels including organic light emitting diodes. Such a pixel unit displays predetermined images to correspond to the scanning signals supplied from the scan driving unit and the data signals supplied from the data distribution unit.

There arises a problem in that the test on such an OELD should be conducted in a test apparatus for testing each OELD. If circuit wires constituting the OELD are changed, or a size of the OELD is varied, then the test equipment should be changed, or a jig required for the test should be changed. Also, efficiency of the test is reduced due to the extended test time and the increased cost because each OELD is separately tested.

SUMMARY OF THE INVENTION

Accordingly, it is an object of the present invention to provide an Organic Electro Luminescence Display (OELD) for performing a sheet unit test on a plurality of the OELDs formed in a motherboard, and a testing method using the OELD.

One object of the present invention is achieved by providing an Organic Electro Luminescence Display (OELD) including: a pixel unit including a plurality of pixels adapted to receive a first power supply voltage, a second power supply voltage and scanning signals and to emit light; a scan driving unit adapted to supply the scanning signals to the pixel unit; a test unit adapted to test whether or not a defect in the pixel unit is present; a first wire group arranged in a first direction and having a floating end; and a second wire group arranged in a second direction and having a floating end.

The first wire group and the second wire group are preferably respectively electrically isolated from the pixel unit, the scan driving unit and the test unit.

The OELD preferably further includes a data driving unit adapted to supply data signals corresponding to externally supplied data to the pixel unit. The OELD preferably further includes a data distribution unit adapted to supply the data signals supplied from the data driving unit to at least two pixels of the pixel unit, the data signals supplied from the data driving unit corresponding to at least two of the selected signals.

The data distribution unit is preferably electrically isolated from the first wire group and the second wire group.

Another object of the present invention is achieved by providing a method of testing a sheet-unit Organic Electro Luminescence Display (OELD) including a plurality of OELDs arranged on a motherboard, to determine whether or not there are any defects of any of the plurality of OELDs, the method including: commonly connecting each of a first wire group and a second wire group to OELDs aligned in the first direction and the second direction with respect to the plurality of OELDs on the motherboard: connecting at least one wire included in either the first wire group or the second wire group to each of the plurality of OELDs to supply a first power supply voltage and a second power supply voltage; supplying a first driving signal to at least one of the plurality of OELDs by wires of the first wire group, and supplying a second driving signal to at least one of the plurality of OELDs by wires of the second wire group; and testing at least one of the plurality of OELDs in response to at least one of the first and the second power supply voltages, the first driving signal and the second driving signal.

At least one of the first wire group and the second wire group preferably further supply a third power supply voltage and a fourth power supply voltage to drive scan driving units arranged in each of the plurality of OELDs; and at least one of the first driving signal and the second driving signal preferably includes either a scan control signal or a test control signal, and a test signal to control the scan driving unit.

The scan control signal preferably includes at least one of clock signals, output enable signals and start pulses of the scan driving units arranged in each of the plurality of OELDs.

The test signal preferably initiates at least one of a lighting test, an aging test and a leakage current test.

Conducting a test on at least one of the plurality of OELDs preferably further includes: generating scanning signals to correspond to the third power supply voltage, the fourth power supply voltage and the scan control signal; supplying the scanning signals to a pixel unit arranged in at least one of the plurality of OELDs; supplying the test signals to the pixel unit in response to the test control signals; and displaying predetermined images on the pixel unit to correspond to the scanning signal and the test signal.

The method preferably further includes supplying the test signals to a plurality of pixels provided in the pixel unit to correspond to a plurality of the selected signals included in at least one of the first driving signals and the second driving signals.

The second driving signal preferably further includes control signals to control whether or not at least one of the first power supply voltage, the second power supply voltage, the third power supply voltage, the fourth power supply voltage and the first driving signals, are supplied to the plurality of OELDs from the first wire group.

The test is preferably conducted on at least one of the plurality of OELDs receiving the first power supply voltage, the second power supply voltage, the third power supply voltage, the fourth power supply voltage, the first driving signals and the second driving signals to correspond to the control signals.

Still another object of the present invention is achieved by providing a motherboard of an Organic Electro Luminescence Display (OELD), including: a plurality of OELDs each including: a pixel unit having a plurality of pixels adapted to receive a first power supply voltage, a second power supply voltage, scanning signals and test signals and to emit light; a scan driving unit adapted to supply the scanning signals to the pixel unit; a test unit adapted to supply the test signals to the pixel unit by data lines; and a data distribution unit adapted to supply the test signals connected between the test unit and the data lines to a plurality of the data lines, the test signals connected between the test unit and the data lines being supplied to output lines of separate test units; a first wire group connected to OELDs of the plurality of the OELDs aligned in a first direction; and a second wire group connected to the OELDs of the plurality of the OELDs aligned in a second; at least one of the first and the second wire groups supplies predetermined test signals and predetermined power supply voltages to self-connected separate OELDs.

At least one of the wires included in the second wire group is preferably electrically connected to at least one of the wires included in the first wire group. The first wire group preferably includes: a first wire adapted to receive the first power supply voltage; a seventh wire adapted to receive the second power supply voltage; a fourth wire adapted to receive a third power supply voltage to drive the scan driving unit; and a fifth wire adapted to receive a fourth power supply voltage to drive the scan driving unit, and the second wire group preferably includes: an eleventh wire adapted to receive the first power supply voltage; a seventeenth wire adapted to receive the second power supply voltage; a fourteenth wire adapted to receive the third power supply voltage to drive the scan driving unit; and a fifteenth wire adapted to receive the fourth power supply voltage to drive the scan driving unit. The first wire and the eleventh wire; the seventh wire and the seventeenth wire; the fourth wire and the fourteenth wire; and the fifth wire and the fifteenth wire are preferably connected to each other. The scan driving unit is preferably adapted to receive the third power supply voltage from the fourteenth wire, and to receive the fourth power supply voltage from the fifteenth wire. The fourteenth wire and the fifteenth wire, and an electrical node of the scan driving unit are preferably arranged outside of a scribing line of an OELD so that they are electrically isolated therefrom after the motherboard is scribed. The pixel unit is preferably adapted to receive the first power supply voltage from the eleventh wire, and to receive the second power supply voltage from the seventeenth wire. The eleventh wire and the seventeenth wire, and an electrical node of the pixel unit are preferably arranged outside of a scribing line of an OELD so that they are electrically isolated therefrom after the motherboard is scribed. The eleventh wire and the seventeenth wire are preferably alternately aligned to be arranged in different rows. The pixel unit is preferably adapted to receive the first power supply voltage from the eleventh wire, and to receive the second power supply voltage from the seventh wire included in the first wire group. The eleventh wire and the seventh wire, and an electrical node of the pixel unit are preferably arranged outside of a scribing line of an OELD so that they are electrically isolated therefrom after the motherboard is scribed. The fourteenth wire and the fifteenth wire are preferably alternately aligned to be arranged in different rows. The scan driving unit is preferably adapted to receive the third power supply voltage from the fourteenth wire, and to receive the fourth power supply voltage from the fifth wire included in the first wire group. The fourteenth wire and the fifth wire, and an electrical node of the scan driving unit are preferably arranged outside of a scribing line of the OELD so that they are electrically isolated therefrom after the motherboard is scribed.

Either the first wire group preferably further includes: second wires adapted to receive at least two selected signals supplied to the data distribution unit; third wires adapted to receive the test control signals and the test signals supplied to the test unit; and sixth wires adapted to receive the scan control signals supplied to the scan driving unit; or the second wire group further includes: twelfth wires adapted to receive the at least two selected signals supplied to the data distribution unit; thirteenth wires adapted to receive the test signals supplied to the test unit; and sixteenth wires adapted to receive the scan control signals supplied to the scan driving unit.

Each second wire is preferably connected to one of the twelfth wires; each third wire is preferably connected to one of the thirteenth wires; and each sixth wire is preferably connected to one of the sixteenth wires. The data distribution unit is preferably connected to one of the second wires and the twelfth wires by the first electrical node; the test unit is preferably connected to one of the third wires and the thirteenth wires by the second electrical node; and the scan driving unit is preferably connected to one of the sixth wires and the sixteenth wires by the third electrical node.

The first electrical node, the second electrical node and the third electrical node are preferably arranged outside of a scribing line of an OELD so that they are electrically isolated therefrom after the motherboard is scribed.

The motherboard preferably further includes a transmission gate adapted to connect at least one of the wires included in the first wire group to each OELD to control supplies of at least one of the signals and the power supply voltages supplied to the OELD from the connected wires. The motherboard preferably further includes an eighteenth wire and a nineteenth wire included in the second wire group, the eighteenth wire and the nineteenth wire connected to gate terminals of the transmission gate to supply the control signals to control turn-on/off of the transmission gate. The first wire group preferably includes second wires adapted to receive at least two selected signals supplied to the data distribution unit, and sixth wires adapted to receive the scan control signals supplied to the scan driving unit, and the second wire group includes thirteenth wires adapted to receive the test signals supplied to the test unit.

The data distribution unit is preferably connected to the second wires by the first electrical node; the scan driving unit is preferably connected to the sixth wires by the second electrical node; and the test unit is preferably connected to the thirteenth wires by the third electrical node.

The first electrical node, the second electrical node and the third electrical node are preferably arranged outside of a scribing line of the OELD so that they are electrically isolated therefrom after the motherboard is scribed.

The test signal is preferably adapted to initiate at least one of a lighting test, an aging test and a leakage current test.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF INVENTION

Figure 1:
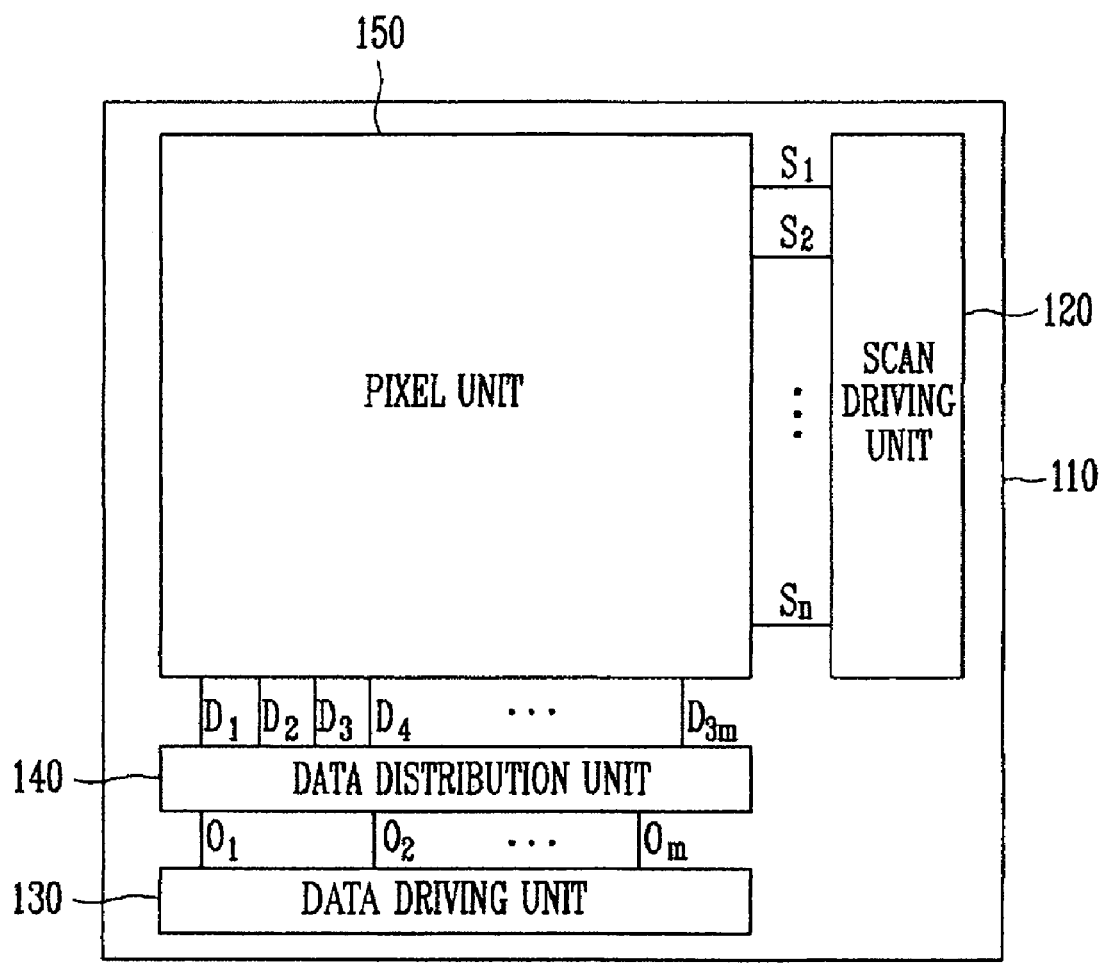
FIG. 1 is a view of an Organic Electro Luminescence Display (OELD) whose scribing has been completed.

FIG. 1 is a view of an Organic Electro Luminescence Display (OELD) whose scribing has been completed.

Referring to FIG. 1, the OELD 110 has a scan driving unit 120, a data driving unit 130, a data distribution unit 140 and a pixel unit 150.

The scan driving unit 120 generates scanning signals. The scanning signals generated by the scan driving unit 120 are sequentially supplied to scanning lines (S1 to Sn).

The data driving unit 130 generates data signals. The data signals generated by the data driving unit 130 are sequentially supplied to output lines (O1 to Om).

The data distribution unit 140 supplies the data signals to at least two data lines (D), the data signals being supplied from the output lines (O1 to Om) of the data driving unit 130.

The pixel unit 150 is composed of a plurality of pixels (not shown) including organic light emitting diodes. Such a pixel unit 150 displays predetermined images to correspond to the scanning signals supplied from the scan driving unit 120 and the data signals supplied from the data distribution unit 140.

There arises a problem in that the test on each OELD 110 must be conducted in a test apparatus for testing each OELD. If circuit wires constituting the OELD 110 are changed, or a size of the OELD 110 is varied, then the test equipment must be changed, or a jig required for the test must be changed. Also, the efficiency of the test is reduced due to the extended test time and the increased cost because each OELD 110 is separately tested.

Hereinafter, exemplary embodiments of the present invention are described with reference to the accompanying FIGS. 2 to 12.

Figure 2:
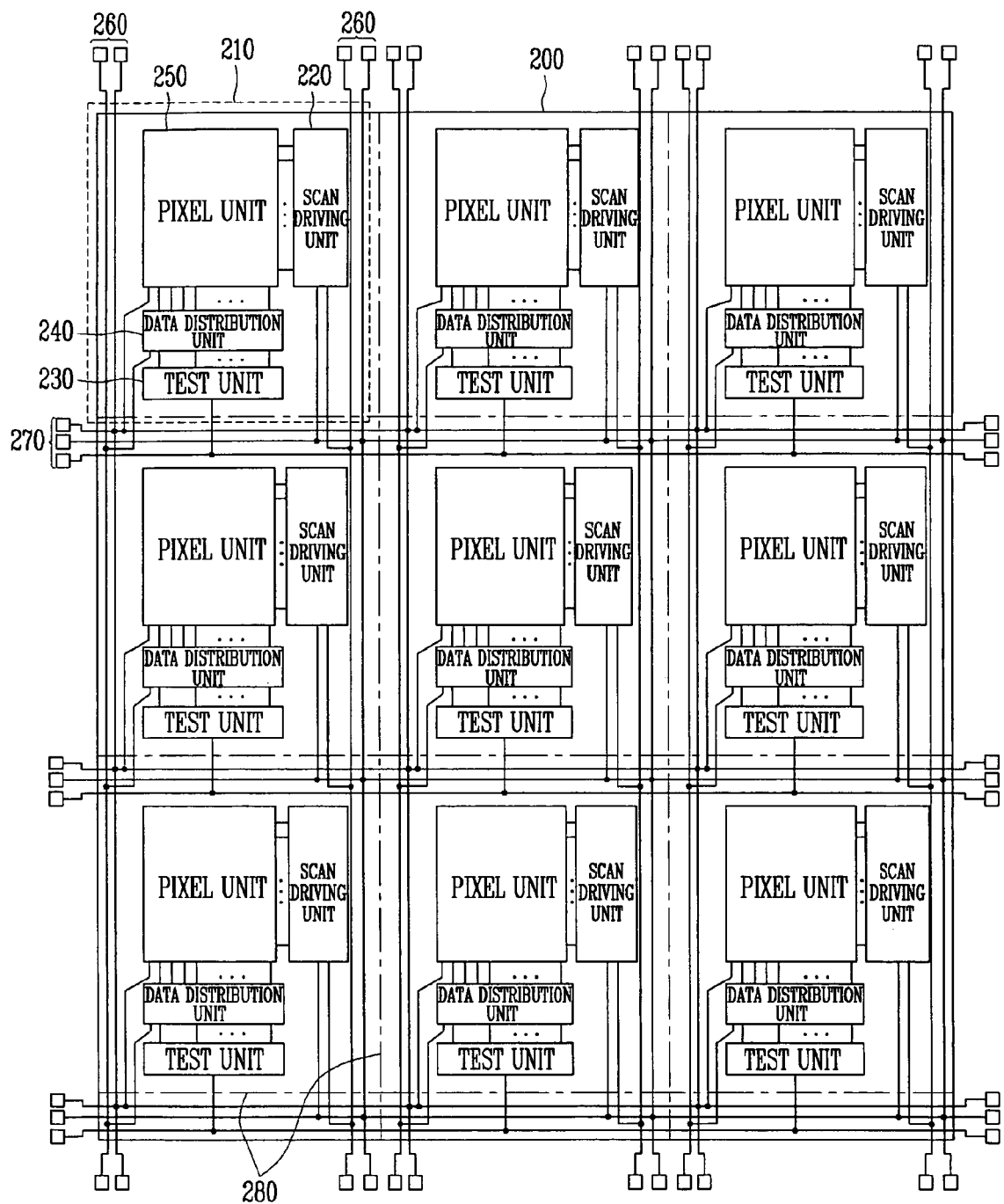
FIG. 2 is a view of a motherboard in which an OELD according to an embodiment of the present invention is formed.

FIG. 2 is a view of a motherboard in which an OELD according to an embodiment of the present invention is formed.

Referring to FIG. 2, the motherboard 200 of the OELD according to an embodiment of the present invention has a plurality of OELDs 210. Each OELD 210 has a scan driving unit 220, a test unit 230, a data distribution unit 240, a pixel unit 250, a first wire group 260 and a second wire group 270.

The first wire group 260 is formed in a vertical direction (the first direction), and commonly connected to the OELDs 210 positioned in the same column on the motherboard 200. The second wire group 270 is formed in a lateral direction (the second direction), and commonly connected to the OELDs 210 positioned in the same row on the motherboard 200. The first and second wire groups, 260 and 270, supply the power supply voltages and the signals for the sheet unit test to at least one of the scan driving units 220, test units 230, data distribution units 240 and pixel units 250, which are formed on each of the OELDs 210.

The scan driving unit 220 receives the scan control signals, the third power supply voltage (VDD) and the fourth power supply voltage (VSS) from the first wire group 260 and/or the second wire group 270. The scan driving unit 220 generates the scanning signals in response to the scan control signal, the third power supply voltage (VDD) and the fourth power supply voltage (VSS). The scanning signals generated by the scan driving unit 220 are supplied to the pixel unit 250.

The test unit 230 receives the test control signal and test signals from the first wire group 260 and/or the second wire group 270. The test signals, which test whether or not defects in the OELD are present, can include, for example, lighting test signals, aging test signals and leakage current test signals and other test signals of the pixels included in the pixel unit 250. The test unit 230 supplies the test signals to the data distribution unit 240 in response to the test control signals.

The data distribution unit 240 receives at least two selected signals from the first wire group 260 and/or the second wire group 270. The data distribution unit 240 receiving the selected signals supplies the test signals, which are supplied to the output lines of each test unit 230, to at least two data lines. The data distribution unit 240 supplies the data signals, which are supplied to the output lines of each data driving unit, to at least two data lines in response to at least two selected signals supplied from the outside when the data driving unit (not shown) is inserted. Hereinafter, for the description convenience, it is assumed that the data distribution unit 240 supplied the test signals, which are supplied to only one output line, to three data lines.

The pixel unit 250 is composed of a plurality of pixels (not shown) including the organic light emitting diodes. One pixel has red, green and blue subpixels, and can further include a white subpixel. The pixel unit 250 receives the first power supply voltage (ELVDD) and the second power supply voltage (ELVSS) supplied from the first wire group 260 and/or the second wire group 270; the scanning signals supplied from the scan driving unit 220; and the test signals supplied from the data distribution unit 240, and then displays predetermined images.

The OELD 210 can further include the data driving unit. The data driving unit generates the data signals in response to the data supplied from the outside, after each OELD 210 has been scribed from the motherboard 200. The data signals generated by the data driving unit are supplied to the data distribution unit 240. As an example, the data driving unit can be mounted to be overlapped with the test unit 230.

The motherboard 200 of such an OELD can supply the power supply voltages and the signals for their tests to a plurality of the OELDs 210 formed on the motherboard 200 by having the first wire group 260 and the second wire group 270. Therefore, the sheet unit tests can be conducted without scribing each OELD 210. Accordingly, this improves the efficiency of the tests by reducing the test time and lowering the cost. Also, if the circuit wires, which constitute the OELD 210, are changed, or a size of the OELD 210 is varied, the test can still be conducted without changing the test equipment or a jig if the sizes of the circuit wires of the first wire group 260 and the second wire group 270, and the motherboard 200 are not changed.

Each OELD 210, which is formed on the motherboard 200, is scribed after the sheet unit tests have been completed. The scribing line 280 are arranged so that the scan driving unit 220, the test unit 230, the data distribution unit 240 and the pixel unit 250 are electrically isolated from the first wire group 260 and the second wire group 270 after the OELD 210 has been scribed. That is to say, electrical nodes between the first wire group 260 and the second wire group 270; and the scan driving unit 220, the test unit 230, the data driving unit 240 and the pixel unit 250 are positioned outside of the scribing line of the OELD 210. Therefore, noise, such as static electricity, is not supplied to the scan driving unit 220, the test unit 230, the data distribution unit 240 and the pixel unit 250, the noise being input to the first wire group 260 and the second wire group 270 from the outside.

Figure 3:
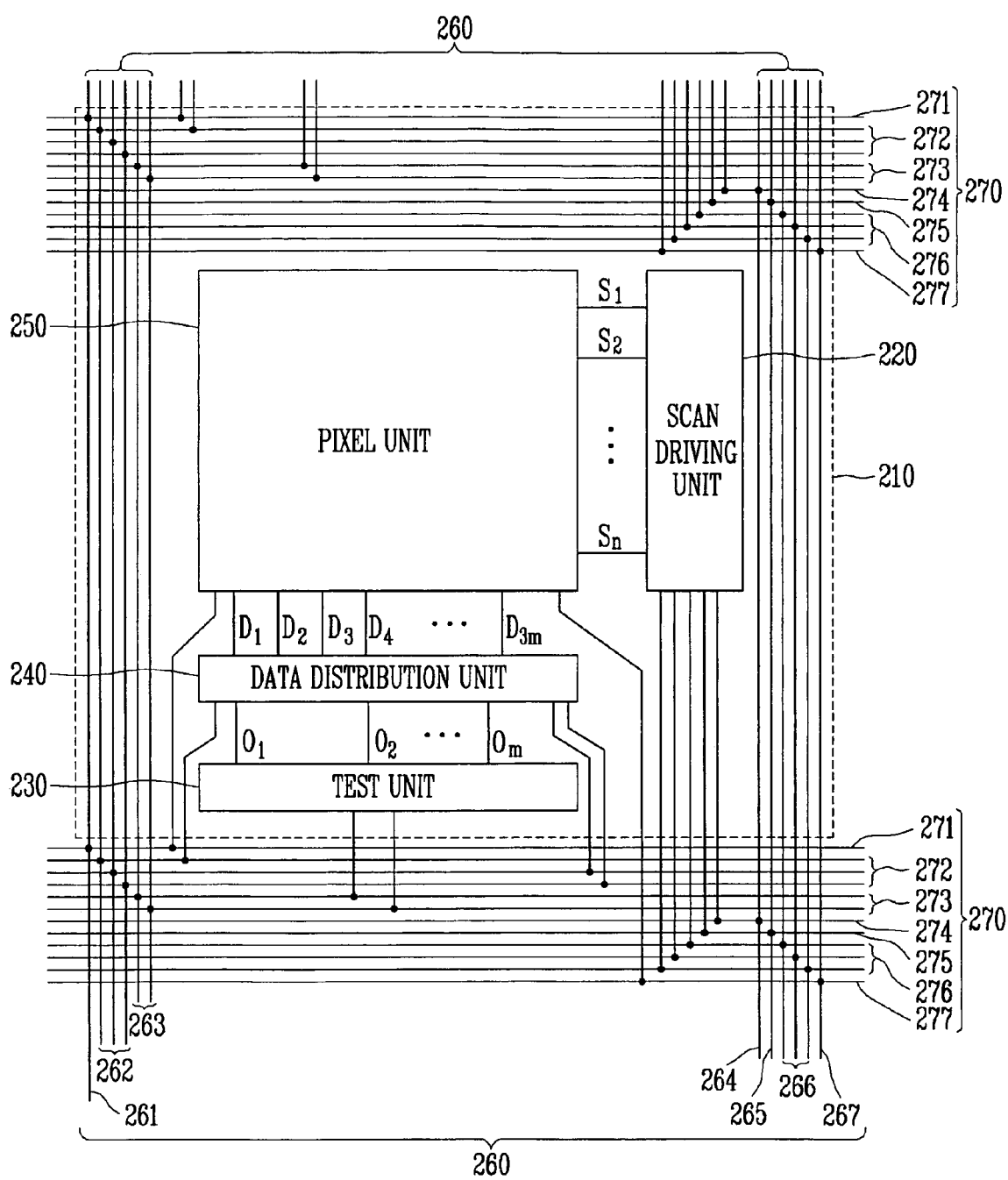
FIG. 3 is a view of the first embodiment of the OELD and the wire groups of FIG. 2.

FIG. 3 is a view of the first embodiment of the OELD and the wire groups of FIG. 2. The same parts as those of FIG. 2 have the same reference numerals, and their descriptions have been omitted below.

Referring to FIG. 3, the OELD 210 according to the first embodiment has the first wire group 260 and the second wire group 270 which include a plurality of wires.

The first wire group 260 includes a first wire 261 for receiving the first power supply voltage (ELVDD), second wires 262 for receiving at least two selected signals, third wires 263 for receiving the test control signals and the test signals, a fourth wire 264 for receiving the third power supply voltage (VDD), a fifth wire 265 for receiving the fourth power supply voltage (VSS), sixth wires 266 for receiving the scan control signals, and a seventh wire 267 for receiving the second power supply voltage (ELVSS).

The first wire 261 supplies the first power supply voltage (ELVDD), which is supplied during the sheet unit test, to the pixel units 250 formed in each OELD 210. The first power supply voltage (ELVDD) supplied to the pixel unit 250 is supplied to the pixels formed in the pixel unit 250.

The second wires 262 supply at least two selected signals to the data distribution unit 240 so that the test signals supplied to each output line (O1 to Om) of the test unit 230 can be supplied to at least two data lines (D). The data distribution unit 240 receives three selected signals since the data distribution unit 240 supplies the test signal, which is supplied to one output line (O), to three data lines (D). For this purpose, the second wires 262 each are composed of three wires.

The third wires 263 receive the test control signals and the test signals from the outside, and then supply them to the test unit 230 formed in each OELD 210. For this purpose, the third wires 263 each are composed of two wires.

The fourth wire 264 supplies the third power supply voltage (VDD), which is supplied during the sheet unit test, to the scan driving units 220 formed in each OELD 210.

The fifth wire 265 supplies the fourth power supply voltage (VSS), which is supplied during the sheet unit test, to the scan driving units 220 formed in each OELD 210.

The sixth wires 266 receives the scan control signals from the outside, and then supply them into the scan driving units 220 formed in each OELD 210. Clock signals, output enable signals and start pulses of the scan driving unit 220 can be included in the scan control signals. Actually, the number of scan control signals supplied to the scan driving unit 220 can be set to a wide range depending on the circuit configuration of the scan driving unit 220. Accordingly, the number of the wires included in the sixth wires 266 is determined depending on the circuit configuration of the scan driving unit 220.

Hereinafter, for the description convenience, it is assumed that three wires are included in the sixth wires 266.

The seventh wire 267 supplies the second power supply voltage (ELVSS), which is supplied during the sheet unit test, to the pixel units 250 formed in each OELD 210. The second power supply voltage (ELVSS) supplied to the pixel unit 250 is supplied to the pixels formed in the pixel unit 250.

The second wire group 270 includes an eleventh wire 271 for receiving the first power supply voltage (ELVDD), twelfth wires 272 for receiving at least two selected signals, thirteenth wires 273 for receiving the test control signals and the test signals, a fourteenth wire 274 for receiving the third power supply voltage (VDD), a fifteenth wire 275 for receiving the fourth power supply voltage (VSS), sixteenth wires 276 for receiving the scan control signals, and a seventeenth wire 277 for receiving the second power supply voltage (ELVSS).

The eleventh wire 271 supplies the first power supply voltage (ELVDD), which is supplied during the sheet unit test, to the pixel unit 250 formed in each OELD 210. For this purpose, the eleventh wire 271 is electrically connected to the first wire 261. The first power supply voltage (ELVDD) supplied to the pixel unit 250 is supplied to the pixels formed in the pixel unit 250.

The twelfth wires 272 supply three selected signals to the data distribution units 240 so that the test signals supplied to each output line (O1 to Om) of the test unit 230 can be supplied to three data lines (D). For this purpose, the twelfth wires 272 are electrically connected to the second wires 262. That is to say, the twelfth wires 272 are each composed of three wires which are identical to the number of second wires 262, and each of the twelfth wires 272 is electrically connected to one of the second wires 262.

The thirteenth wires 273 receive the test control signals and the test signals from the outside, and then supply them to the test unit 230 formed in each OELD 210. For this purpose, the thirteenth wires 273 are electrically connected to the third wires 263. That is to say, the thirteenth wires 273 each are composed of two wires which are identical to the number of third wires 263, and each of the thirteenth wires 273 is electrically connected to one of the third wires 263.

The fourteenth wire 274 supplies the third power supply voltage (VDD), which is supplied during the sheet unit test, to the scan driving unit 220 formed in each OELD 210. For this purpose, the fourteenth wire 274 is electrically connected to the fourth wire 264.

The fifteenth wire 275 supplies the fourth power supply voltage (VSS), which is supplied during the sheet unit test, to the scan driving unit 220 formed in each OELD 210. For this purpose, the fifteenth wire 275 is electrically connected to the fifth wire 265.

The sixteenth wires 276 receive the scan control signals from the outside, and then supply them to the scan driving unit 220 formed in each OELD 210. For this purpose, the sixteenth wires 276 are electrically connected to the sixth wires 266. That is to say, the sixteenth wires 276 are each composed of three wires which are identical to the number of sixth wires 266, and each of the sixteenth wires 276 is electrically connected to one of the sixth wires 266.

The seventeenth wire 277 supplies the second power supply voltage (ELVSS), which is supplied during the sheet unit test, to the pixel unit 250 formed in each OELD 210. For this purpose, the seventeenth wire 277 is electrically connected to the seventh wire 267. The second power supply voltage (ELVSS) supplied to the pixel unit 250 is supplied to the pixels formed in the pixel unit 250.

The numbers of the wires included in the second wires 262, the third wires 263, the sixth wires 266, the twelfth wires 272, the thirteenth wires 273 and the sixteenth wires 276 are not limited to those of the embodiments of the present invention. That is to say, the number of wires can be set to a wide range to correspond to the kind of the test, the number of distributed data lines and the circuit configuration of the scan driving unit 220.

In such a first embodiment of the present invention, the scan driving unit 220, the test unit 230, the data distribution unit 240 and the pixel unit 250 receive the power supply voltages and the signals from the wires included in the second wire group 270. The electrical nodes of the second wire group 270 are arranged so that the electrical nodes are electrically isolated from the scan driving unit 220, the test unit 230, the data distribution unit 240 and the pixel unit 250 after the OELD 210 has been scribed. Accordingly, the noise input from the outside after scribing is not transmitted to the scan driving unit 220, the test unit 230, the data distribution unit 240 and the pixel unit 250.

As described above, the first to seventh wires (261 to 267) and the eleventh to seventeenth wires 271 to 277 of the first embodiment are arranged in a mesh configuration to electrically connect the wires receiving the same power supply voltages or signals. Therefore, the sheet unit test can be conducted according to the motherboard 200 of the OELD according to the first embodiment of the present invention. Also, a voltage drop (IR drop), a signal delay (RC delay) and other problems can be minimized by forming the power supply voltage lines and the signal lines all in the mesh configuration so that the power supply voltage lines and the signal lines can be included in the first wire group 260 and the second wire group 270.

Figure 4:
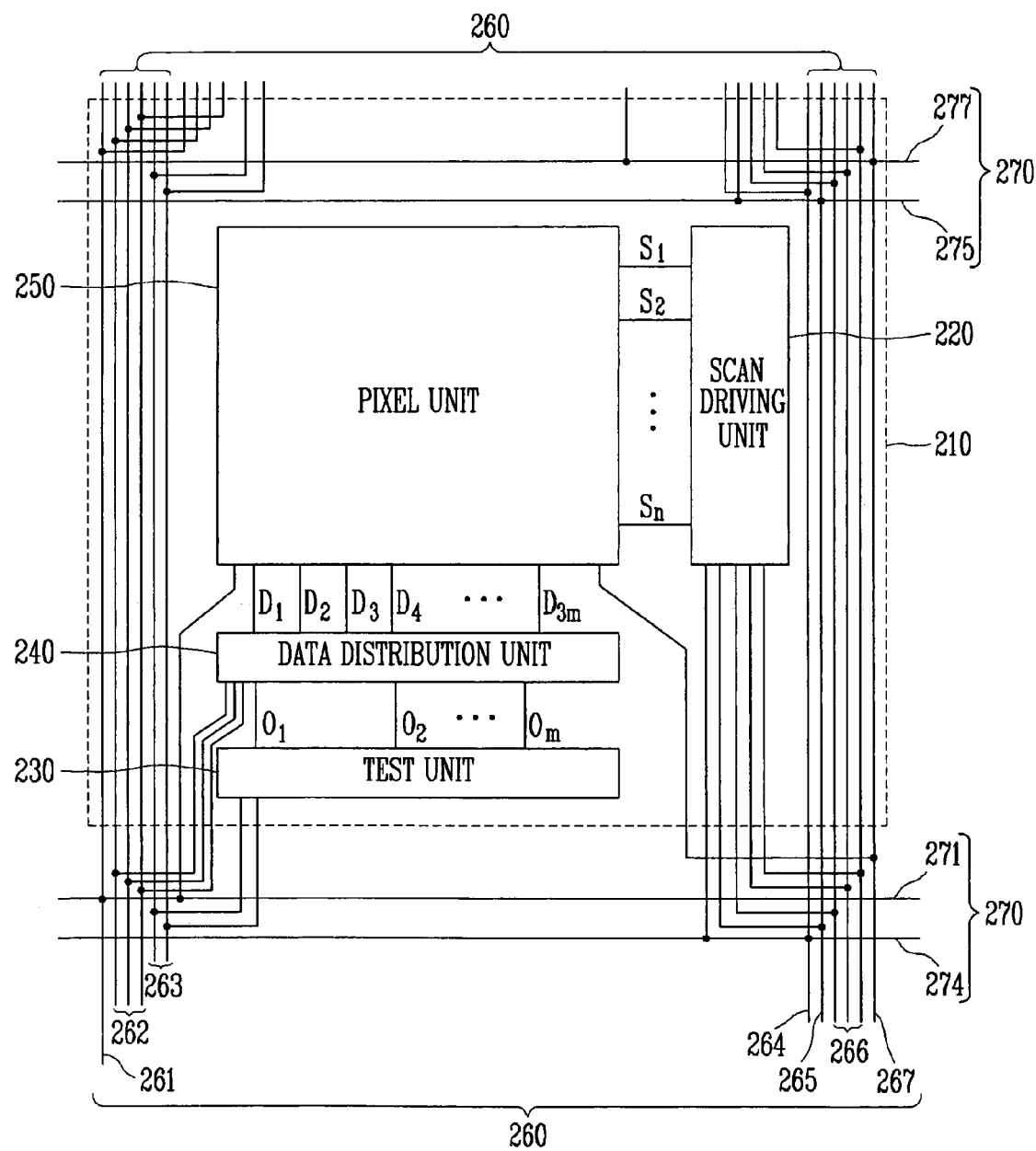
FIG. 4 is a view of the second embodiment of the OELD and the wire groups of FIG. 2.

FIG. 4 is a view of the second embodiment of the OELD and the wire groups of FIG. 2. The same parts as in FIG. 2 have the same reference numerals, and therefore their descriptions have been omitted below.

Referring to FIG. 4, the OELD 210 according to the second embodiment has the first wire group 260 and the second wire group 270 which include a plurality of wires.

The first wire group 260 includes a first wire 261 for receiving the first power supply voltage (ELVDD), second wires 262 for receiving at least two selected signals, third wires 263 for receiving the test control signals and the test signals, a fourth wire 264 for receiving the third power supply voltage (VDD), a fifth wire 265 for receiving the fourth power supply voltage (VSS), sixth wires 266 for receiving the scan control signals, and a seventh wire 267 for receiving the second power supply voltage (ELVSS). The signals or the power supply voltages supplied to such a first wire group 260 are identical to those of FIG. 3, and therefore their descriptions have been omitted below.

The second wire group 270 has an eleventh wire 271 for receiving the first power supply voltage (ELVDD), a fourteenth wire 274 for receiving the third power supply voltage (VDD), a fifteenth wire 275 for receiving the fourth power supply voltage (VSS), and a seventeenth wire 277 for receiving the second power supply voltage (ELVSS).

The eleventh wire 271 supplies the first power supply voltage (ELVDD), which is supplied during the sheet unit test, to the pixel unit 250 formed in each OELD 210. For this purpose, the eleventh wire 271 is electrically connected to the first wire 261. The first power supply voltage (ELVDD) supplied to the pixel unit 250 is supplied to the pixels formed in the pixel unit 250.

The fourteenth wire 274 supplies the third power supply voltage (VDD), which is supplied during the sheet unit test, to the scan driving unit 220 formed in each OELD 210. For this purpose, the fourteenth wire 274 is electrically connected to the fourth wire 264.

The fifteenth wire 275 supplies the fourth power supply voltage (VSS), which is supplied during the sheet unit test, to the scan driving unit 220 formed in each OELD 210. For this purpose, the fifteenth wire 275 is electrically connected to the fifth wire 265.

The seventeenth wire 277 supplies the second power supply voltage (ELVSS), which is supplied during the sheet unit test, to the pixel unit 250 formed in each OELD 210. For this purpose, the seventeenth wire 277 is electrically connected to the seventh wire 267. The second power supply voltage (ELVSS) supplied to the pixel unit 250 is supplied to the pixels formed in the pixel unit 250.

The eleventh wire 271 and the fourteenth wire 274; and the fifteenth wire 275 and the seventeenth wire 277 are alternately positioned in different rows so as to arrange the power supply voltage lines more easily and to effectively use spaces in which the power supply voltage lines are arranged. For example, the eleventh wire 271 and the fourteenth wire 274 can be arranged in the odd-numbered rows, and the fifteenth wire 275 and the seventeenth wire 277 can be arranged in the even-numbered rows. Also, the eleventh wire 271 and the fourteenth wire 274 can be arranged in the even-numbered rows, and the fifteenth wire 275 and the seventeenth wire 277 can be arranged in the odd-numbered rows.

In the second embodiment of the present invention, the scan driving unit 220 receives the fourth power supply voltage (VSS) and the scan control signals from the fifth wires 265 and the sixth wires 266 out of the first wire group 260. The scan driving unit 220 receives the third power supply voltage (VDD) from the fourteenth wire 274 out of the second wire group 270.

The test unit 230 receives the test control signals and the test signals from the third wires 263 out of the first wire group 260.

The data distribution unit 240 receives the selected signals from the second wires 262 out of the first wire group 260.

The pixel unit 250 receives the second power supply voltage (ELVSS) from the seventh wire 267 out of the first wire group 260, and receives the first power supply voltage (ELVDD) from the eleventh wire 271 out of the second wire group.

The electrical nodes of the first wire group 260 and/or the second wire group 270 and the first wire group 260 are arranged outside a scribing line of the OELD 210 so that the electrical nodes are electrically isolated from the scan driving unit 220, the test unit 230, the data distribution unit 240 and the pixel unit 250 after the OELD 210 has been scribed.

As described above, in the second embodiment, the signal lines (namely, the second wires 262, the third wires 263 and the sixth wires 266) are included only in the first wire group The power supply voltage lines (namely, the first wire 261, the fourth wire 264, the fifth wire 265, the seventh wire 267, the eleventh wire 271, the fourteenth wire 274, the fifteenth wire 275 and the seventeenth wire 277) are formed in a mesh configuration so that they can be included in both the first wire group 260 and the second wire group 270.

Actually, the signals can normally drive the scan driving unit 220, the test unit 230 and the data distribution unit 240, though the voltage drop (IR drop) and other drops occur, if only a certain level of voltage is sustained. Accordingly, in this embodiment, the signal lines are included only in the first wire group 260. Therefore, the manufacturing cost and dead space are reduced, and also effectiveness of the design is secured since the number of wires included in the second wire group 270 is reduced compared to that of the first embodiment of FIG. 3. Also, the OELDs 210 can be tested in the unit of columns since the signal lines are formed only in one direction (namely, the first direction). That is to say, a predetermined test can be conducted only on the OELDs 210 positioned in certain columns by supplying the signals to the signal lines positioned in the certain columns.

If a voltage drop (IR drop) occurs in the power supply voltages supplied to both the first wire group 260 and the second wire group 270, then there arises a problem in that desired images are not displayed. Accordingly, in this embodiment, desired images can be displayed by arranging the power supply voltage lines in both the first direction and the second direction in a mesh configuration. The power supply voltage lines can be more easily arranged and the space in which the power supply voltage lines are arranged can be utilized more effectively by alternating the eleventh wire 271 and the fourteenth wire 274; and the fifteenth wire 275 and the seventeenth wire 277 in different ways.

Figure 5:
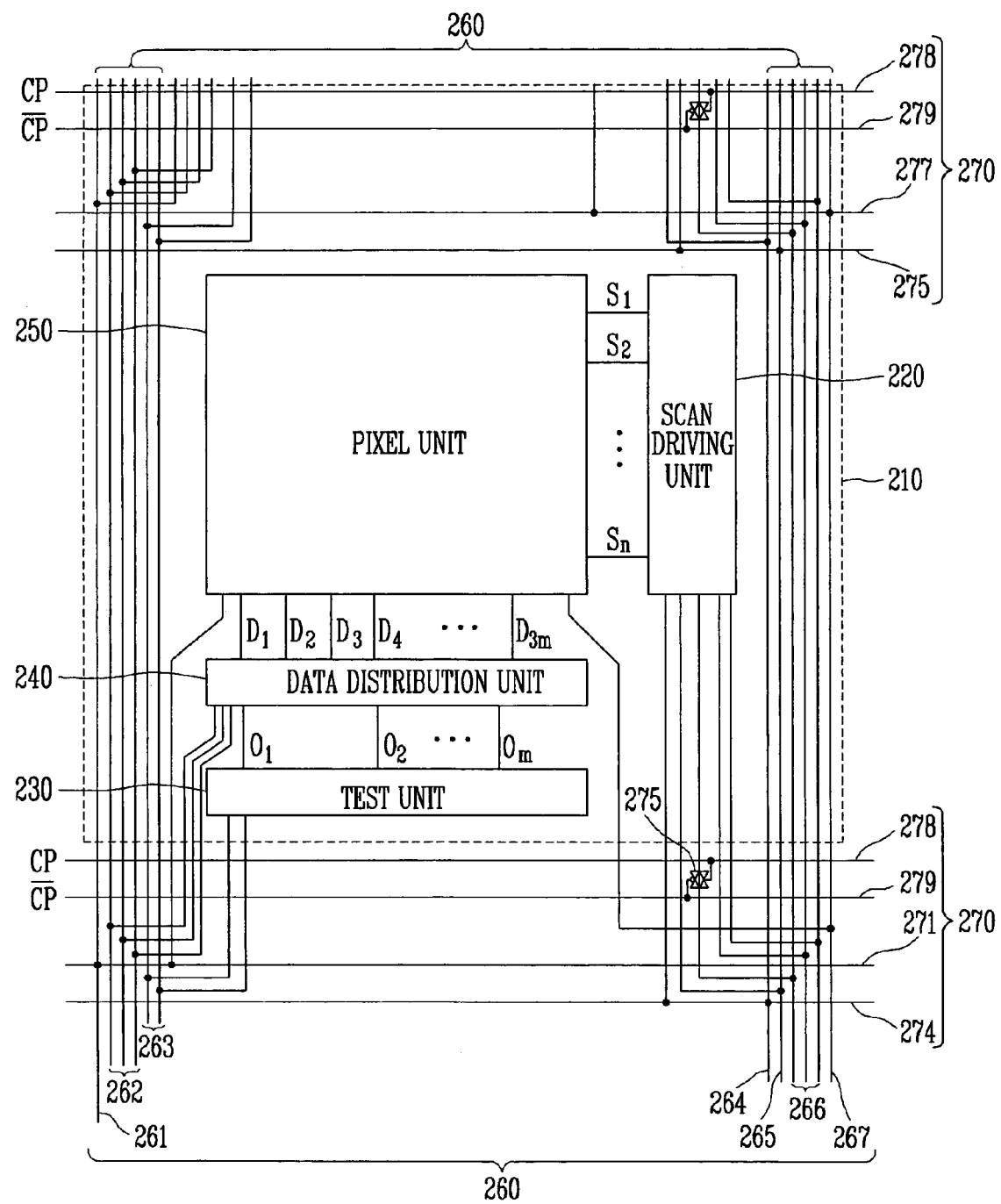
FIG. 5 is a view of the third embodiment of the OELD and the wire groups of FIG. 2.

FIG. 5 is a view of a third embodiment of the OELD and the wire groups of FIG. 2. In the description of FIG. 5, the descriptions of the same parts as in FIG. 4 have been omitted below.

Referring to FIG. 5, the OELD 210 according to the third embodiment of the present invention has a transmission gate 275 connected to at least one of the wires included in the first wire group 260, and an eighteenth wire 278 and a nineteenth wire 279 included in the second wire group 270 to drive the transmission gate 275.

In the third embodiment of the present invention, the transmission gate 275 is connected to one of the wires included in the first wire group 260 to control whether or not the signals (or the power supply voltages) are supplied to the OELD 210 from the connected wires. For example, the transmission gate 275 can be positioned in any one of the sixth wires 266 for supplying the scan control signals. As described above, it is possible to conduct the test on the certain OELD in the motherboard 200 if the transmission gate 275 is connected to one of the sixth wires 266 to control whether or not the scan control signals are supplied. That is to say, turn-on/off of the transmission gate 275 can be controlled to select the OELD 210 in the unit of row since the scanning signals are not generated in the scan driving unit 220 which does not receive the scan control signals. Although the transmission gate 275 is connected to one of the wires included in the first wire group 260 for illustration purposes, the transmission gate 275 can actually be connected to any one or all of the wires included in the first wire group 260.

The eighteenth wire 278 and the nineteenth wire 279 are included in the second wire group 270, and connected to the gate terminal of the transmission gate 275 to supply control signals (CP, /CP) for controlling turn-on/off of the transmission gate 275.

The test procedure on the certain OELD 210 is described in detail as follows. At first, the power supply voltages are supplied to the motherboard 200. The control signals (CP, /CP) are supplied to the eighteenth wire 278 and the nineteenth wire 279 which are positioned in the certain rows, and simultaneously the signals are supplied only to the signal lines (namely, the second wires 262, the third wires 263 and the sixth wires 266) positioned in the certain columns. Then, a predetermined test is performed only on the OELD 210 positioned in the points where the certain rows and the certain columns cross over. That is to say, in the third embodiment of the present invention, the test on the certain OELD can be conducted on the motherboard 200 by installing at least one transmission gate 275 to be connected to at least one of the wires included in the first wire group 260.

In the third embodiment, the scan driving unit 220 receives the fourth power supply voltage (VSS) and the scan control signals from the fifth wire 265 and the sixth wires 266 out of the first wire group 260. The scan driving unit 220 receives the third power supply voltage (VDD) from the fourteenth wire 274 out of the second wire group 270.

The test unit 230 receives the test control signals and the test signals from the third wires 263 out of the first wire group 260.

The data distribution unit 240 receives the selected signals from the second wires 262 out of the first wire group 260.

The pixel unit 250 receives the second power supply voltage (ELVSS) from the seventh wire 267 out of the first wire group 260, and receives the first power supply voltage (ELVDD) from the eleventh wire 271 out of the second wire group 270.

At least one of the scan driving unit 220, the test unit 230, the data distribution unit 240 and the pixel unit 250 controls whether or not the signals (or the power supply voltages) are supplied using the transmission gate 275.

The electrical nodes of the second wire group 260 are arranged outside a scribing line of the OELD 210 so that the electrical nodes are electrically isolated from the scan driving unit 220, the test unit 230, the data distribution unit 240 and the pixel unit 250 after the OELD 210 has been scribed.

As described above, in the third embodiment of the present invention, the test on the certain OELD 210 can be conducted on the motherboard 200 by having at least one transmission gate 275 connected to at least one of the wires included in the first wire group 260.

Figure 6:
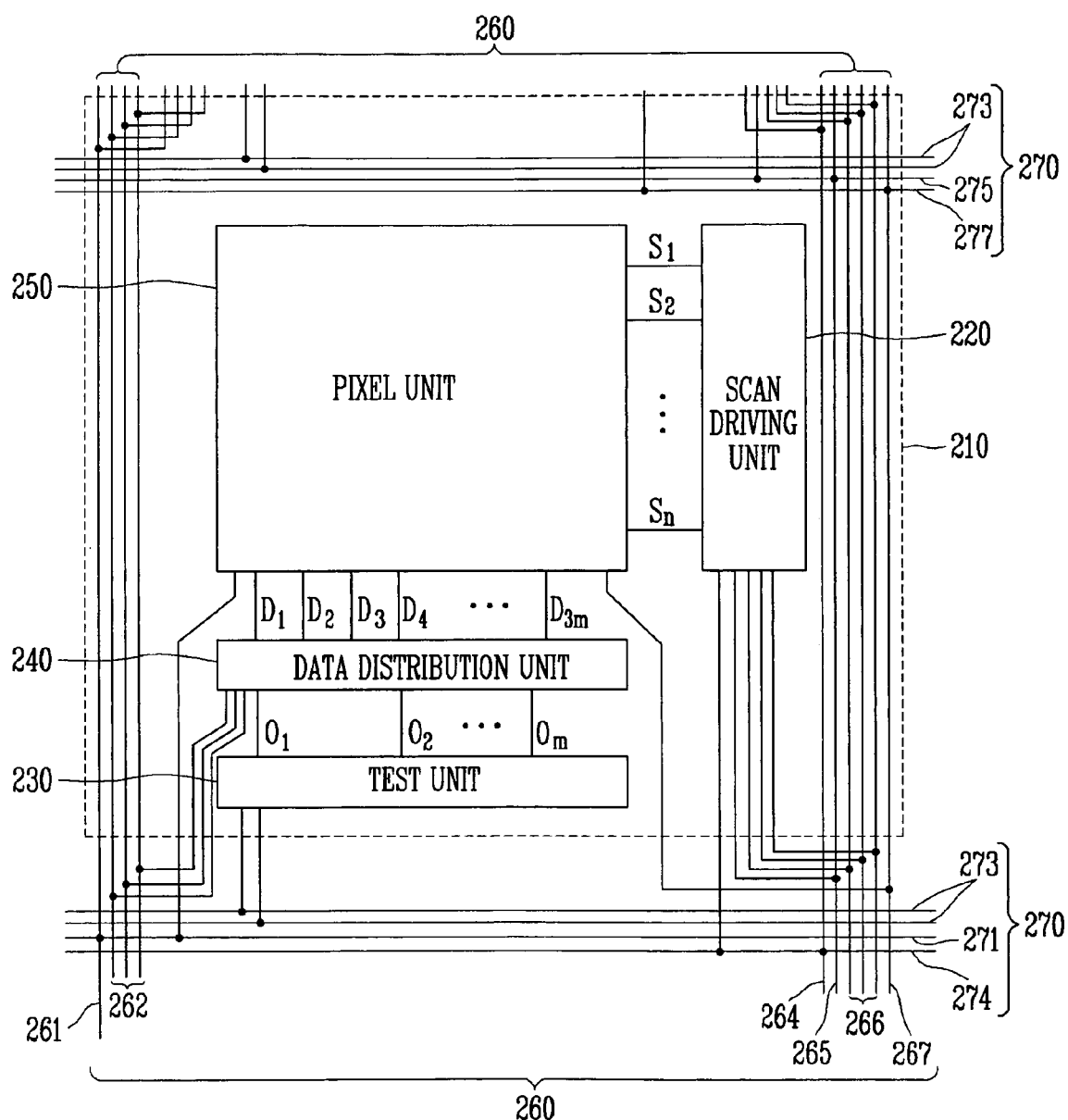
FIG. 6 is a view of the fourth embodiment of the OELD and the wire groups of FIG. 2.

FIG. 6 is a view of a fourth embodiment of the OELD and the wire groups of FIG. 2.

Referring to FIG. 6, the OELD 210 according to the fourth embodiment of the present invention has the first wire group 260 and the second wire group 270 which include a plurality of wires.

The first wire group 260 has a first wire 261 for receiving the first power supply voltage (ELVDD), second wires 262 for receiving at least two selected signals, a fourth wire 264 for receiving the third power supply voltage (VDD), a fifth wire 265 for receiving the fourth power supply voltage (VSS), sixth wires 266 for receiving the scan control signals, and a seventh wire 267 for receiving the second power supply voltage (ELVSS).

The first wire 261 supplies the first power supply voltage (ELVDD), which is supplied during the sheet unit test, to the pixel unit 250 formed in each OELD 210. The first power supply voltage (ELVDD) supplied to the pixel unit 250 is supplied to the pixels formed in the pixel unit 250.

The second wires 262 supplies at least two selected signals to the data distribution unit 240 so that the test signals supplied to each output line (O1 to Om) of the test unit 230 can be supplied to at least two data lines (D). The data distribution unit 240 receives three selected signals because the test signal supplied to one output line (O) is supplied to three data lines (D). For this purpose, the second wires 262 each are composed of three wires.

The fourth wire 264 supplies the third power supply voltage (VDD), which is supplied during the sheet unit test, to the scan driving unit 220 formed in each OELD 210.

The fifth wire 265 supplies the fourth power supply voltage (VSS), which is supplied during the sheet unit test, to the scan driving unit 220 formed in each OELD 210.

The sixth wires 266 receive the scan control signals from the outside, and then supply them to the scan driving unit 220 formed in each OELD 210. Clock signals, output enable signals and start pulses of the scan driving unit 220 can be included in the scan control signals. Actually, the number of scan control signals supplied to the scan driving unit 220 can be set to a wide range depending on the circuit configuration of the scan driving unit 220. Accordingly, the number of wires included in the sixth wires 266 is determined depending on the circuit configuration of the scan driving unit 220.

In the present invention, it is assumed that three wires are included in the sixth wires 266 for the description convenience.

The seventh wire 267 supplies the second power supply voltage (ELVSS), which is supplied during the sheet unit test, to the pixel unit 250 formed in each OELD 210. The second power supply voltage (ELVSS) supplied to the pixel unit 250 is supplied to the pixels formed in the pixel unit 250.

The second wire group 270 has an eleventh wire 271 for receiving the first power supply voltage (ELVDD), thirteenth wires 273 for receiving the test control signals and the test signals, a fourteenth wire 274 for receiving the third power supply voltage (VDD), a fifteenth wire 275 for receiving the fourth power supply voltage (VSS), and a seventeenth wire 277 for receiving the second power supply voltage (ELVSS).

The eleventh wire 271 supplies the first power supply voltage (ELVDD), which is supplied during the sheet unit test, to the pixel unit 250 formed in each OELD 210. For this purpose, the eleventh wire 271 is electrically connected to the first wire 261. The first power supply voltage (ELVDD) supplied to the pixel unit 250 is supplied to the pixels formed in the pixel unit 250.

The thirteenth wires 273 receive the test control signals and the test signals from the outside, and then supply them to the test unit 230 formed in each OELD 210. For this purpose, the thirteenth wires 273 are each composed of two wires.

The fourteenth wire 274 supplies the third power supply voltage (VDD), which is supplied during the sheet unit test, to the scan driving unit 220 formed in each OELD 210. For this purpose, the fourteenth wire 274 is electrically connected to the fourth wire 264.

The fifteenth wire 275 supplies the fourth power supply voltage (VSS), which is supplied during the sheet unit test, to the scan driving unit 220 formed in each OELD 210. For this purpose, the fifteenth wire 275 is electrically connected to the fifth wire 265.

The seventeenth wire 277 supplies the second power supply voltage (ELVSS), which is supplied during the sheet unit test, to the pixel unit 250 formed in each OELD 210. For this purpose, the seventeenth wire 277 is electrically connected to the seventh wire 267. The second power supply voltage (ELVSS) supplied to the pixel unit 250 is supplied to the pixels formed in the pixel unit 250.

The eleventh wire 271 and the fourteenth wire 274; and the fifteenth wire 275 and the seventeenth wire 277 are alternately positioned in different rows so as to arrange the power supply voltage lines more easily and to effectively use spaces in which the power supply voltage lines are arranged. For example, the eleventh wire 271 and the fourteenth wire 274 can be arranged in the odd-numbered rows, and the fifteenth wire 275 and the seventeenth wire 277 can be arranged in the even-numbered rows. Also, the eleventh wire 271 and the fourteenth wire 274 can be arranged in the even-numbered rows, and the fifteenth wire 275 and the seventeenth wire 277 can be arranged in the odd-numbered rows.

In the fourth embodiment, the scan driving unit 220 receives the fourth power supply voltage (VSS) and the scan control signals from the fifth wire 265 and the sixth wires 266 out of the first wire group 260. The scan driving unit 220 receives the third power supply voltage (VDD) from the fourteenth wire 274 out of the second wire group 270.

The test unit 230 receives the test control signals and the test signals from the thirteenth wires 273 out of the second wire group 270.

The data distribution unit 240 receives the selected signals from the second wires 262 out of the first wire group 260.

The pixel unit 250 receives the second power supply voltage (ELVSS) from the seventh wire 267 out of the first wire group 260, and receives the first power supply voltage (ELVDD) from the eleventh wire 271 out of the second wire group 270.

The electrical nodes of the first wire group 260 and/or the second wire group 270 are arranged outside a scribing line of the OELD 210 so that the electrical nodes are electrically isolated from the scan driving unit 220, the test unit 230, the data distribution unit 240 and the pixel unit 250 after the OELD 210 has been scribed.

As described above, each of the power supply voltage lines included in the first wire group 260 is electrically connected to one of the power supply voltage lines included in the second wire group 270 in the fourth embodiment of the present invention. That is to say, the power supply voltage lines are formed in both of the first direction and the second direction in a mesh configuration. Therefore, a desired pattern of images can be displayed.

In the fourth embodiment of the present invention, the thirteenth wires 273, which are the signal lines out of the second wire group 270, are not connected to the wires included in the first wire group 260. As a result, the test on a certain OELD 210 can be conducted on the motherboard 200 without adding wires.

The test procedure on a certain OELD 210 is described in detail as follows. At first, the power supply voltages are supplied to the motherboard 200. The test control signals and the test signals are supplied to the thirteenth wires 273 positioned in certain rows, and simultaneously the signals are supplied only in the signal lines (namely, the second wires 262 and the sixth wires 266) positioned in certain columns. Then, a predetermined test is performed only on the OELD 210 positioned on the points where the certain rows and the certain columns cross over.

Figure 7:
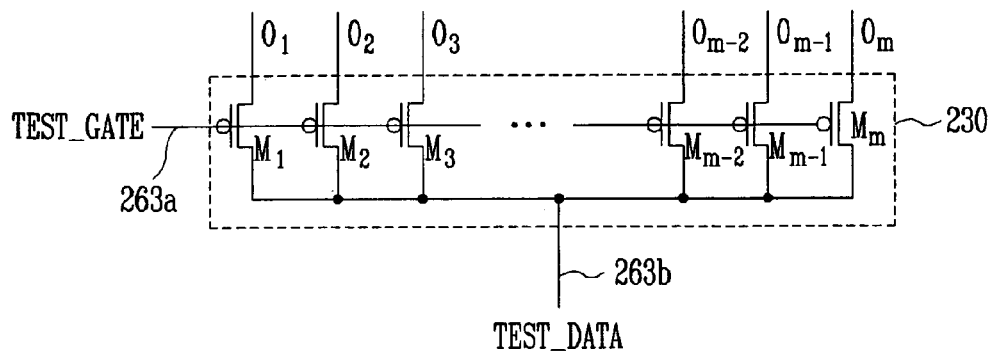
FIG. 7 is a circuit diagram of an example of the test units of FIGS. 2 to 6.

FIG. 7 is a circuit diagram of an example of the test units of FIGS. 2 to 6.

Referring to FIG. 7, the test unit 230 has a plurality of transistors (M1 to Mm). They are shown in FIG. 7 as PMOS transistors. However, the present invention is not limited thereto.

The gate electrodes of the plurality of transistors (M1 to Mm) are connected to test control signal lines 263a included in the third wires 263 (or, the thirteenth wire 273). The first electrodes of the plurality of transistors (M1 to Mm) are connected to test signal lines 263b included in the third wires 263 (or, the thirteenth wire 273), and the second electrodes of the plurality of transistors (M1 to Mm) are connected to output lines (O1 to Om).

The test procedure is described in detail as follows. At first, the third power supply voltage (VDD), the fourth power supply voltage (VSS) and the scan control signals are supplied to the scan driving unit 220 from the fourth wire 264 (or the fourteenth wire 274), the fifth wire 265 (or the fifteenth wire 275) and the sixth wire 266 (or the sixteenth wire 276), respectively. The scan driving unit 220 then generates the scanning signals and supplies them to the pixel unit 250.

The test control signals (TEST_GATE) (a low level) are supplied to the transistors (M1 to Mm) from the test control signal line 263a to turn on the transistors (M1 to Mm).

If the transistors (M1 to Mm) turned on, then the test signals (TEST_DATA) supplied to the test signal line 263b are supplied to the output lines (O1 to Om).

Subsequently, the test signals (TEST_DATA) supplied to the output lines (O1 to Om) are supplied to the data lines (D1 to D3m) via the data distribution unit 240 to correspond to three selected signals.

The pixels, which are included in each OELD 210 to receive the scanning signals and the test signals (TEST_DATA) then emit light in a predetermined form to correspond to the test signals (TEST_DATA). For example, the pixels emit light to correspond to lighting test signals if the lighting test signals are supplied as the test signals (TEST_DATA). Some pixels may not emit light in a desired form. As a result, it can be confirmed whether or not hot pixels are present. Also, the white valance of the pixels can be measured and progressive defects can be also sensed since the same lighting test signals are supplied to the pixels.

Aging test signals are also supplied as the test signals (TEST_DATA). The aging test signals, which supply a high bias voltage or bias current to the data lines (D1 to D3m), detect the progressive defects of the organic light emitting diode. Also, it may be confirmed whether or not the organic light emitting diodes operate normally during changes in the temperature by setting a substrate 200 to the level of low temperature or high temperature, followed by supplying the lighting test signals.

Leakage current test signals can also be supplied as the test signals (TEST_DATA). The leakage current test is conducted by measuring the currents flowing into the first wire 261 (or the eleventh wire 271) and the seventh wire 267 (or the seventeenth wire 277) when the first power supply voltage (ELVDD) and the second power supply voltage (ELVSS) remain to be supplied to the pixels. That is to say, when the first power supply voltage (ELVDD) and the second power supply voltage (ELVSS) remain to be supplied, the leakage current can be measured by measuring the currents flowing into the first wire 261 (or the eleventh wire 271) and the seventh wire 267 (or the seventeenth wire 277) after the test unit 230 is turned off as a whole.

Figure 8:
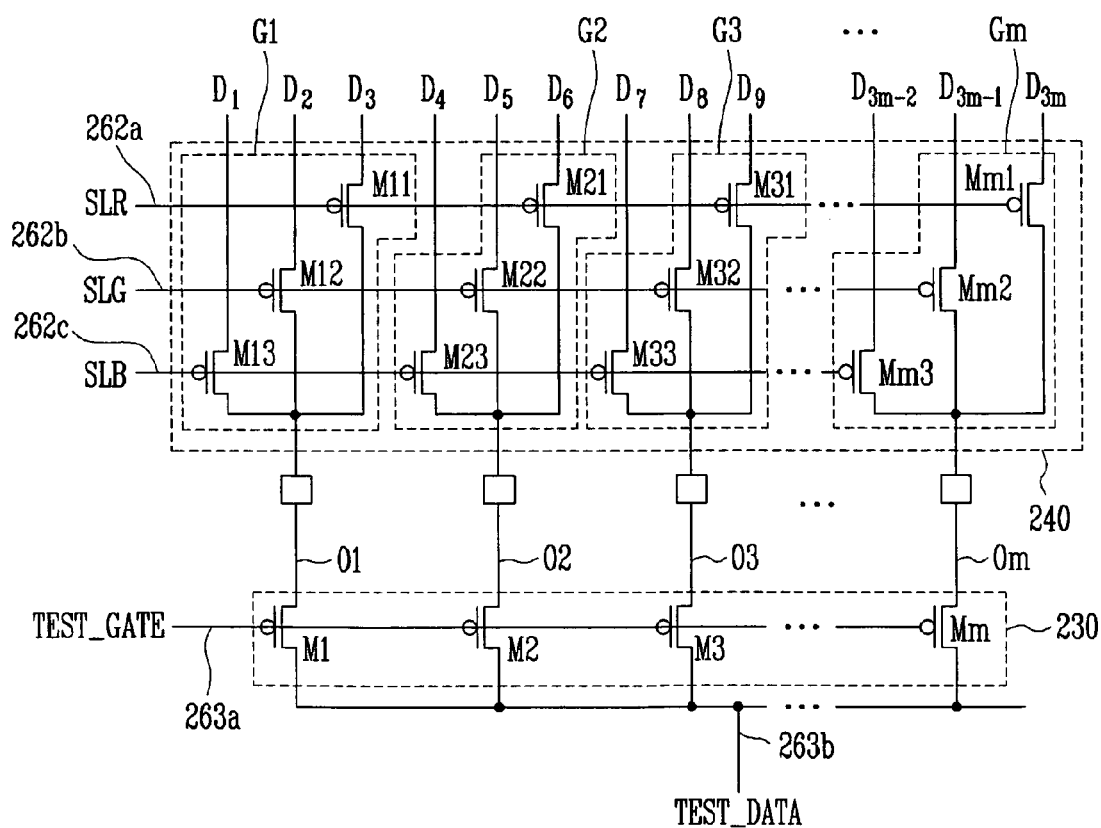
FIG. 8 is a circuit diagram of an example of the test units and the data distribution unit of FIGS. 2 to 6.

FIG. 8 is a circuit diagram of an example of the test unit and the data distribution unit of FIGS. 2 to 6.

Referring to FIG. 8, the data distribution unit 240 includes transistor groups (G1 to Gm) respectively connected to output lines (O1 to Om) of each test unit 230.

The transistor groups (G1 to Gm) each include three transistors, and each transistor is connected to one of the red, green and blue pixels. That is to say, each of three data lines connected to three transistors is respectively connected to each of the red, green and blue pixels.

Each of the transistor groups (G1 to Gm) has the first transistors (M11, M21, . . . , Mm1) connected to the red-selected signal lines 262a included in the second wires 262; the second transistors (M12, M22 . . . , Mm2) connected to the green-selected signal lines 262b included in the second wires 262; and the third transistors (M13, M23 . . . , Mm3) connected to the blue-selected signal lines 262c included in the second wires 262.

Each of the first transistors (M11, M21, . . . , Mm1) is turned on to supply the test signals, which are supplied from the output lines (O1 to Om) of the test unit, to the red pixels connected to the data lines (D3, D6, . . . , D3m) when red-selected signals (SLRs) are supplied from the red-selected signal lines 262a.

Each of the second transistors (M12, M22, . . . , Mm2) is turned on to supply the test signals, which are supplied from the output lines (O1 to Om) of the test unit, to the green pixels connected to the data lines (D2, D5, . . . , D3m−1) when the green-selected signals (SLGs) are supplied from the green-selected signal lines 262b.

Each of the third transistors (M13, M23, . . . , Mm3) is turned on to supply the test signals, which are supplied from the output lines (O1 to Om) of the test unit, to the blue pixels connected to the data lines (D1, D4, . . . , D3m−2) when the blue-selected signals (SLBs) are supplied from the blue-selected signal lines 262c.

The red-selected signals (SLRs), the green-selected signals (SLGs) and the blue-selected signals (SLBs) are supplied at different times. As described above, if the red-selected signals (SLRs), the green-selected signals (SLGs) and the blue-selected signals (SLBs) are supplied at different times, then the test signals supplied to each output line (O) can be divided and supplied to three data lines (D).

Figure 9:
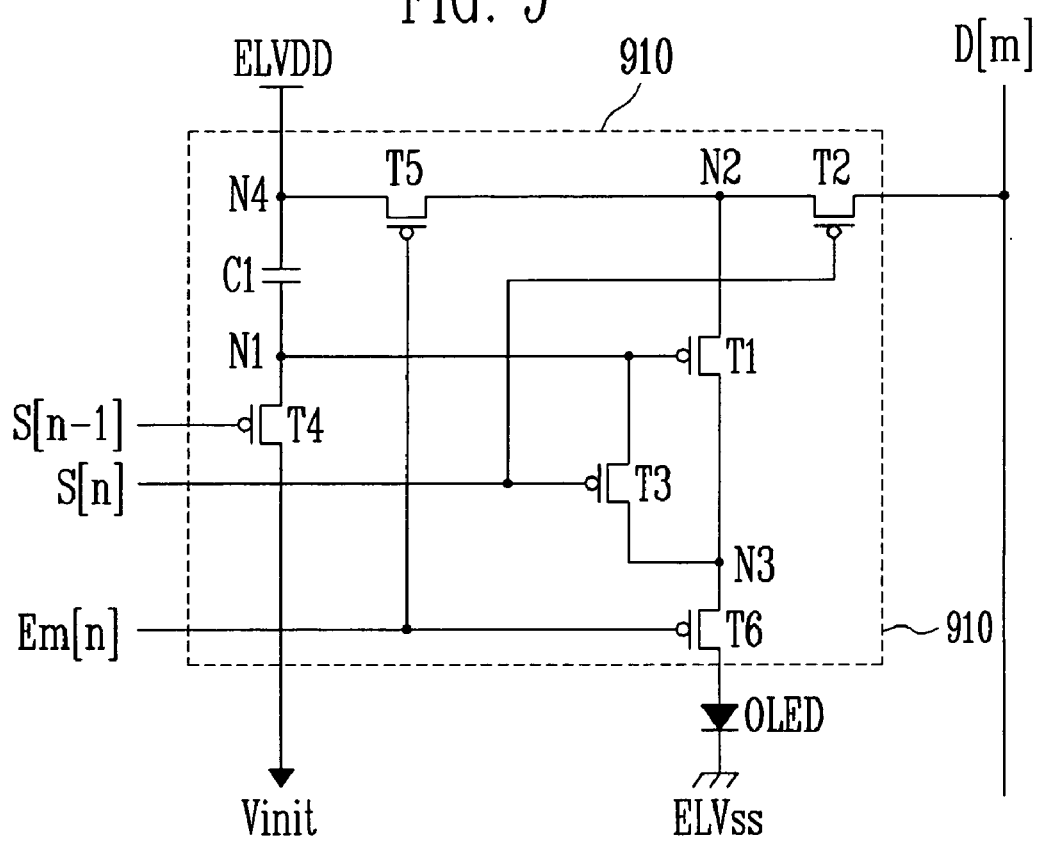
FIG. 9 is a circuit diagram of an example of a pixel used to explain a lighting test.

FIG. 9 is a circuit diagram of an example of a pixel used to explain a lighting test. For convenience, FIG. 9 shows the pixels connected to the $n^{th}$ scanning line, the $n^{th}$ light emitting control line and the $m^{th}$ data line.

Referring to FIG. 9, the pixels each have an organic light emitting diode; and pixel circuits 910 connected to the n-$1^{st}$ scanning line (Sn−1), the $n^{th}$ scanning line (Sn), the $n^{th}$ light emitting control line (Emn), the $m^{th}$ data lines (Dm), the first power supply voltage (ELVDD), the reset power supply voltage (Vinit) and the organic light emitting diode.

The first electrode of the organic light emitting diode is connected to the pixel circuit 910, and the second electrode is connected to the second power supply voltage (ELVSS). The organic light emitting diode generates a predetermined light corresponding to the current supplied to the pixel circuit 910.

The pixel circuit 910 has first to sixth transistors (T1 to T6) and a first capacitor (C1).

The gate electrode of the first transistor (T1) is connected to the first node (N1). The first electrode of the first transistor (T1) is connected to the second node (N2), and the second electrode is connected to the third node (N3). The first transistor (T1) controls the currents flowing into the third node (N3) from the second node (N2) to correspond to the voltages supplied to its gate electrode.

The gate electrode of the second transistor (T2) is connected to the $n^{th}$ scanning line (Sn). The first electrode of the second transistor (T2) is connected to the $m^{th}$ data lines (Dm), and the second electrode is connected to the second node (N2). The second transistor (T2) is turned on to supply the data signals, which are supplied to the $m^{th}$ data lines (Dm), to the second node (N2) when the scanning signals are supplied to the $n^{th}$ scanning lines (Sn).

The gate electrode of the third transistor (T3) is connected to the $n^{th}$ scanning line (Sn). The first electrode of the third transistor (T3) is connected to the third node (N3), and the second electrode is connected to the first node (N1). The third transistor (T3) is turned on to connect the first transistor (T1) as a diode when the scanning signals are supplied to the $n^{th}$ scanning line (Sn).

The gate electrode of the fourth transistor (T4) is connected to the n-$1^{st}$ scanning line (Sn−1). The first electrode of the fourth transistor (T4) is connected to the reset power supply voltage (Vinit), and the second electrode is connected to the first node (N1). The fourth transistor (T4) is turned on to supply the voltage of the reset power supply voltage (Vinit) to the first node (N1) when the scanning signals are supplied to the n-1$^{st}$ scanning line (Sn-1).

The gate electrode of the fifth transistor (T5) is connected to the n$^{th}$ light emitting control line (Emn). The first electrode of the fifth transistor (T5) is connected to the fourth node (N4), and the second electrode is connected to the second node (N2). The fifth transistor (T5) is turned on to supply the first power supply voltage (ELVDD) to the second node (N2) when the light emitting control signals are not supplied to the n$^{th}$ light emitting control line (Emn) (That is to say, when low levels of signals are input to the n$^{th}$ light emitting control line (Emn)).

The gate electrode of the sixth transistor (T6) is connected to the n$^{th}$ light emitting control line (Emn). The first electrode of the sixth transistor (T6) is connected to the third node (N3), and the second electrode is connected to an anode electrode of the organic light emitting diode. The sixth transistor (T6) is turned on to electrically connect the organic light emitting diode to the third node (N3) when the light emitting control signals are not supplied to the n$^{th}$ light emitting control line (Emn).

One side terminal of the first capacitor (C1) is connected to the fourth node (N4), and the other side terminal is connected to the first node (N1). The first capacitor (C1) charges to voltages corresponding to the data signals and a threshold voltage (Vth) of the first transistor (T1), and sustains the charged voltages during one frame when the scanning signals are supplied to the n$^{th}$ canning line (Sn).

Figure 10A:
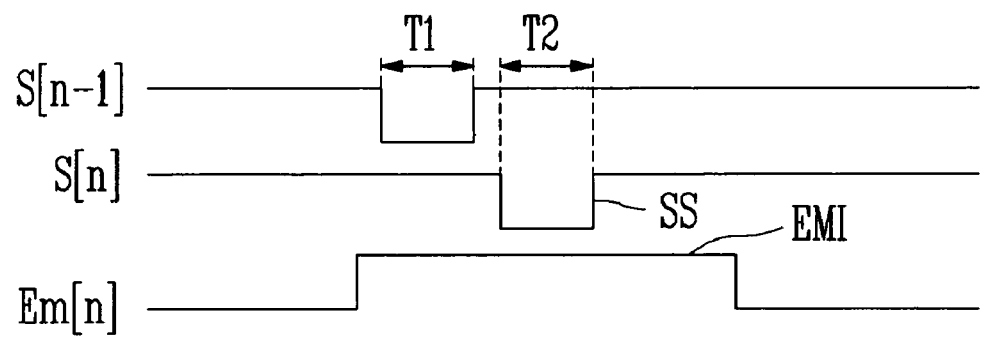
FIG. 10A are waveforms of control signals for controlling a pixel circuit when the pixels of FIG. 9 is operated normally.
Figure 10B:
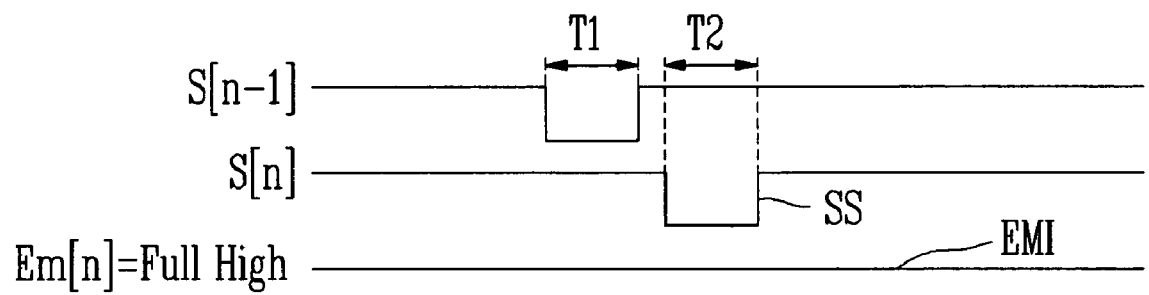
FIG. 10B are waveforms of control signals for controlling the pixel circuit of FIG. 9 when the lighting test is conducted.

FIG. 10A is a waveform of control signals for controlling a pixel circuit when the pixels of FIG. 9 are normally operated. FIG. 10B is a waveform of control signals for controlling the pixel circuit shown in FIG. 9 when the lighting test is conducted. Hereinafter, an operation mode of the pixel of FIG. 9 will described in detail in combination with FIG. 9 and FIGS. 10A and 10B.

Referring to FIG. 10A, the scanning signals (SSs) are first supplied to the n-1$^{st}$ scanning line (Sn-1), and the light emitting control signals (EMIs) are first supplied to the n$^{th}$ light emitting control line (Emn) during a T1 period. If the light emitting control signals (EMIs) are supplied to the n$^{th}$ light emitting control line (Emn), then the fifth and sixth transistors (T5, T6) are turned off. If the scanning signals (SSs) are supplied to the n-1$^{st}$ scanning line (Sn-1), then the fourth transistor (T4) is turned on. If the fourth transistor (T4) is turned on, then a voltage of the first node (N1) is changed to a reset power supply voltage (Vinit). The reset power supply voltage (Vinit) is set to have a lower voltage value than a voltage value of the data signal.

Subsequently, the scanning signals (SSs) are supplied to the n$^{th}$ scanning line (Sn) during a T2 period. If the scanning signals (SSs) are supplied to the n$^{th}$ scanning line (Sn), then the second and third transistors (T2, T3) are turned on.

If the third transistor (T3) is turned on, then the first transistor (T1) is connected as a diode.

If the second transistor (T2) is turned on, then the data signals supplied to the m$^{th}$ data line (Dm) are supplied to the second node (N2). The first transistor (T1) is turned on since a voltage value of the first node (N1) is changed to a voltage value of the reset power supply voltage (Vinit) (That is to say, the first node (N1) is set to have a lower voltage than a voltage of the second node (N2)). If the first transistor (T1) is turned on, then the data signals, which are supplied to the second node (N2), are supplied to the first node (N1) via the first transistor (T1) and the third transistor (T3). The first capacitor (C1) charges to a voltage corresponding to a voltage difference between the first node (N1) and the fourth node (N4) (namely, the first power supply voltage (ELVDD)).

A voltage value of the first node (N1) is set to a value obtained by subtracting a threshold voltage of the first transistor (T1) from the data signals since the data signals are supplied to the first node (N1) via the first transistor (T1) and the third transistor (T3). Accordingly, the first capacitor (C1) is charged to voltages corresponding to the threshold voltages of the first transistor (T1) and data signals.

Subsequently, if the light emitting control signals (EMIs) are not supplied to the n$^{th}$ light emitting control line (Emn), then the fifth and sixth transistors (T5, T6) are turned on. If the fifth transistor (T5) is turned on, then the first power supply voltage (ELVDD) is supplied to the second node (N2) via the fifth transistor (T5). If the sixth transistor (T6) is turned on, then the current supplied from the first transistor (T1) is supplied to the organic light emitting diode to correspond to a voltage charged by the first capacitor (C1). Accordingly, light corresponding to the data signals are generated by the organic light emitting diode regardless of the threshold voltage of the first transistor (T1).

Referring to FIG. 10B, the scanning signals (SSs) are first supplied to the n-1$^{st}$ scanning line (Sn-1), and the light emitting control signals (EMIs) are supplied to the n$^{th}$ light emitting control line (Emn) during a T1 period. If the light emitting control signals (EMIs) are supplied to the n$^{th}$ light emitting control line (Emn), then the fifth and sixth transistors (T5, T6) are turned off. If the scanning signals (SSs) are supplied to the n-1$^{st}$ scanning line (Sn-1), then the fourth transistor (T4) is turned on. If the fourth transistor (T4) is turned on, then a voltage of the first node (N1) is changed to the reset power supply voltage (Vinit). The reset power supply voltage (Vinit) is set to have a lower voltage value than a voltage value of the data signals.

Subsequently, the scanning signals (SSs) are supplied to the n$^{th}$ scanning line (Sn) during T2 period. If the scanning signals (SSs) are supplied to the n$^{th}$ scanning line (Sn), then the second and third transistors (T2, T3) are turned on. If the third transistor (T3) is turned on, then the first transistor (T1) is connected as a diode.

If the second transistor (T2) is turned on, then the data signals supplied to the m$^{th}$ data lines (Dm) are supplied to the second node (N2). The first transistor (T1) is turned on since a voltage value of the first node (N1) is changed to the reset power supply voltage (Vinit) (That is to say, the first node (N1) is set to have a lower voltage than a voltage of the second node (N2)). If the first transistor (T1) is turned on, then the data signals, which are supplied to the second node (N2), are supplied to the first node (N1) via the first transistor (T1) and the third transistor (T3). The first capacitor (C1) charges to a voltage corresponding to a difference between the first node (N1) and the fourth node (N4) (namely, the first power supply voltage (ELVDD)).

A voltage value of the first node (N1) is set to a value obtained by subtracting a threshold voltage of the first transistor (T1) from the data signals since the data signals are supplied to the first node (N1) via the first transistor (T1) and the third transistor (T3). Accordingly, the first capacitor (C1) is charged to voltages corresponding to the threshold voltages of the data signals and the first transistor (T1).

The light emitting control signals (EMIs) continue to be supplied to the n$^{th}$ light emitting control line (Emn) to conduct the lighting test. Voltages corresponding to the data signals are then saved in the first capacitor (C1) during a T2 period, but the sixth transistor (T6) is turned off, and then the organic light emitting diode does not emit light. In this case, all pixels included in the pixel unit 250 of each OELD 210 should be sustained in a turned-off state. Accordingly, the lighting test of the OELD 210 can be conducted by testing whether the pixels included in the pixel unit 250 are turned on or turned off.

Figure 11:
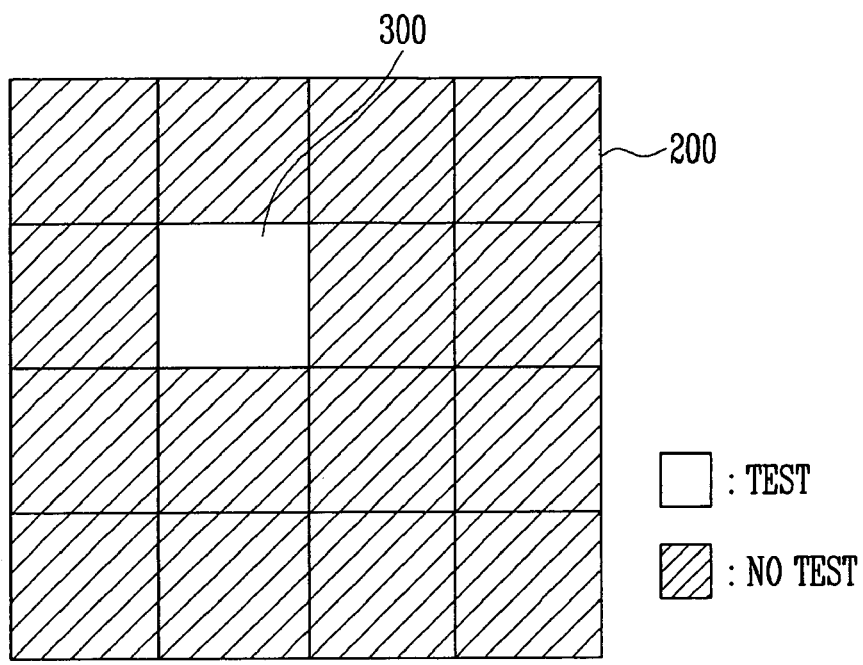
FIG. 11 is a view of an embodiment where the sheet unit test is conducted on the motherboard of the OELD.

FIG. 11 is a view of an embodiment where the sheet unit test is conducted on the motherboard of the OELD. Each of the OELDs of the motherboard of FIG. 11 is an OELD according to the fourth embodiment of FIG. 6.

Referring to FIG. 11, the first power supply voltage (ELVDD) and the second power supply voltage (ELVSS) are first supplied to the first wire 261 (and/or the eleventh wire 271) and the seventh wire 267 connected to the certain OELD 300 formed in the motherboard 200. The power supply voltages and the signals are supplied to the second wires 262, the fourth wire 264 (and/or the fourteenth wire 274), the fifth wire 265, the sixth wires 266 and the thirteenth wires 273, which are respectively connected to the certain OELD 300. The test is then conducted only on the certain OELD 300, but the test is not conducted on the other OELDs 210.

The test procedure is described in detail as follows. At first, the first power supply voltage and the second power supply voltage are supplied to the first wire 261 (and/or the eleventh wire 271) and the seventh wire 267 connected to the certain OELD 300. The third power supply voltage (VDD), the fourth power supply voltage (VSS) and the scan control signals are supplied from the fourth wire 264 (and/or the fourteenth wire 274), the fifth wire 265 and the sixth wires 266 which are respectively connected to the certain OELD 300. The scan driving unit 220, which is provided in the certain OELD 300, then generates the scanning signals and/or the light emitting control signals. The test unit 230, which is provided in the certain OELD 300, receives the test control signals (TEST_GATE) and the test signals (TEST_DATA) from the thirteenth wire 273. The test unit 230 then supplies the test signal (TEST_DATA) to the data distribution unit 240 to correspond to the test control signals (TEST_GATE). The data distribution unit 240 supplies the test signals (TEST_DATA), which are supplied from the test unit 230, to the pixel unit 250 via the data lines (D1 to Dm) to correspond to the red-selected signals (SLRs), the green-selected signals (SLGs) and the blue-selected signals (SLBs) which are respectively supplied from the second wires 262. If the aging test signals, the leakage current test signals, the lighting test signals and other test signals are supplied as the test signals (TEST_DATA), then the aging test, the leakage current test and the lighting test can be sequentially conducted on the certain OELD 300. in addition, various tests on the selected OELD 300 can be conducted, and the order of the tests can be changed.

In the present invention, the test can also be conducted on the at least two OELDs 210 formed in the motherboard 200. In this case, the power supply voltages and the signals are supplied to the first wire (and/or the eleventh wire 271), the second wires 262, the fourth wire 264 (and/or the fourteenth wire 274), the fifth wire 265, the sixth wires 266, the seventh wire 267 and the thirteenth wires 273 which are respectively connected to at least two OELDs 210.

Figure 12:
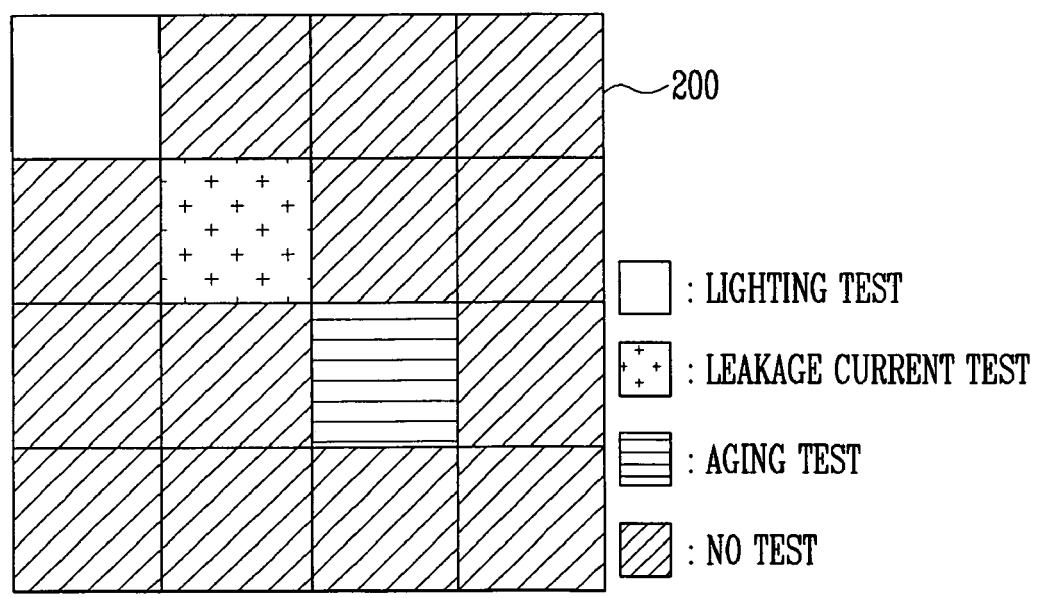
FIG. 12 is a view of another embodiment where the sheet unit test is conducted on the motherboard of the OELD.

FIG. 12 is a view of another embodiment where the sheet unit test is conducted on the motherboard of the OELD. Each of the OELDs of the motherboard of FIG. 12 is the OELD according to the fourth embodiment of FIG. 6.

Referring to FIG. 12, the power supply voltages and the signals are supplied to a plurality of the first wires (and/or the eleventh wires 271), the second wires 262, the fourth wires 264 (and/or the fourteenth wires 274), the fifth wires 265, the sixth wires 266, the seventh wires 267 and the thirteenth wires 273, which each are respectively connected to the OELD arranged in the first row and column, the OELD arranged in the second row and column, and the OELD arranged in the third row and column on the motherboard 200.

The signal for the lighting test is supplied to the OELD arranged in the first row and column as the test signal (TEST_DATA). The lighting test is then conducted on the OELD arranged in the first row and column.

The signal for the leakage current test is supplied to the OELD arranged in the second row and column as the test signal (TEST_DATA). The leakage current test is then conducted on the OELD arranged in the second row and column.

The signal for the aging test is supplied to the OELD arranged in the third row and column as the test signal (TEST_DATA). The aging test is then conducted on the OELD arranged in the third row and column.

The lighting test, the leakage current test and the aging test can be conducted at the same time and sequentially. If the tests on the selected OELDs have been completed, then the tests of FIG. 12 are shifted by one column or by one row and then conducted again. Such a test is performed until the tests on all of the OELDs formed on the motherboard 200 have been completed.

Thought technical ideas of the present invention has been described in detail with reference to the exemplary embodiments, the embodiments mentioned herein are just examples for the purpose of illustrations only, and are not intended to limit the scope of the present invention. Also, it should be understood that various equivalents and modifications could be made thereto without departing from the spirit and scope of the present invention, which is apparent to those skilled in the art pertaining to the present invention.

As described above, the OELD and the testing method using the OELD according to the present invention can supply the power supply voltages and the signals for its tests to a plurality of the OELDs formed on the motherboard since there is a first wire group and a second wire group. Therefore, the sheet unit test can be conducted without scribing each OELD. Accordingly, it can be useful to increase the efficiency of the test, for example, the test time can be shortened and the cost can be reduced. Only the test on the certain OELD can be conducted. Also, even if the circuit wires constituting the OELD, or a size of the OELD are changed, the test can still be conducted without changing the test equipment or the jig if the circuit wires of the first wire group, the circuit wires of the second wire group, and the motherboard are not changed in their sizes.

What is claimed is:

1. A motherboard of an Organic Electro Luminescence Display (OELD), comprising:
   a plurality of OELDs each including:
      a pixel unit having a plurality of pixels to receive a first power supply voltage, a second power supply voltage, scanning signals and test signals and to emit light;
      a scan driving unit to supply the scanning signals to the pixel unit;
      a test unit to supply the test signals to the pixel unit by data lines; and
      a data distribution unit to supply the test signals connected between the test unit and the data lines to a plurality of the data lines, the test signals connected between the test unit and the data lines being supplied to output lines of separate test units;
   a first wire group connected to OELDs of the plurality of the OELDs aligned in a first direction; and
   a second wire group connected to OELDs of the plurality of the OELDs aligned in a second direction which crosses the first direction;

wherein at least one of the first and the second wire groups supplies predetermined test signals and predetermined power supply voltages to self-connected separate OELDs.

2. The motherboard of an OELD according to claim 1, wherein at least one of the wires included in the second wire group is electrically connected to at least one of the wires included in the first wire group.

3. The motherboard of an OELD according to claim 1, wherein the first wire group comprises:
- a first wire to receive the first power supply voltage;
- a seventh wire to receive the second power supply voltage;
- a fourth wire to receive a third power supply voltage to drive the scan driving unit; and
- a fifth wire to receive a fourth power supply voltage to drive the scan driving unit, and wherein the second wire group comprises:
- an eleventh wire to receive the first power supply voltage;
- a seventeenth wire to receive the second power supply voltage;
- a fourteenth wire to receive the third power supply voltage to drive the scan driving unit; and
- a fifteenth wire to receive the fourth power supply voltage to drive the scan driving unit.

4. The motherboard of an OELD according to claim 3, wherein the first wire and the eleventh wire; the seventh wire and the seventeenth wire; the fourth wire and the fourteenth wire; and the fifth wire and the fifteenth wire are connected to each other.

5. The motherboard of an OELD according to claim 4, wherein the scan driving unit receives the third power supply voltage from the fourteenth wire, and receives the fourth power supply voltage from the fifteenth wire.

6. The motherboard of an OELD according to claim 5, wherein the fourteenth wire and the fifteenth wire, and an electrical node of the scan driving unit are arranged outside of a scribing line of an OELD so that they are electrically isolated therefrom after the motherboard is scribed.

7. The motherboard of an OELD according to claim 4, wherein the pixel unit receives the first power supply voltage from the eleventh wire, and receives the second power supply voltage from the seventeenth wire.

8. The motherboard of an OELD according to claim 7, wherein the eleventh wire and the seventeenth wire, and an electrical node of the pixel unit are arranged outside of a scribing line of an OELD so that they are electrically isolated therefrom after the motherboard is scribed.

9. The motherboard of an OELD according to claim 3, wherein the eleventh wire and the seventeenth wire are alternately aligned to be arranged in different rows.

10. The motherboard of an OELD according to claim 9, wherein the pixel unit receives the first power supply voltage from the eleventh wire, and receives the second power supply voltage from the seventh wire included in the first wire group.

11. The motherboard of an OELD according to claim 10, wherein the eleventh wire and the seventh wire, and an electrical node of the pixel unit are arranged outside of a scribing line of an OELD so that they are electrically isolated therefrom after the motherboard is scribed.

12. The motherboard of an OELD according to claim 3, wherein the fourteenth wire and the fifteenth wire are alternately aligned to be arranged in different rows.

13. The motherboard of an OELD according to claim 12, wherein the scan driving unit receives the third power supply voltage from the fourteenth wire, and receives the fourth power supply voltage from the fifth wire included in the first wire group.

14. The motherboard of an OELD according to claim 13, wherein the fourteenth wire and the fifth wire, and an electrical node of the scan driving unit are arranged outside of a scribing line of the OELD so that they are electrically isolated therefrom after the motherboard is scribed.

15. The motherboard of an OELD according to claim 1, wherein the first wire group comprises second wires to receive at least two selected signals supplied to the data distribution unit, and sixth wires to receive the scan control signals supplied to the scan driving unit, and wherein the second wire group comprises thirteenth wires to receive the test signals supplied to the test unit.

16. The motherboard of an OELD according to claim 15, wherein:
- the data distribution unit is connected to the second wires by a first electrical node;
- the scan driving unit is connected to the sixth wires by a second electrical node; and
- the test unit is connected to the thirteenth wires by a third electrical node.

17. The motherboard of an OELD according to claim 16, wherein the first electrical node, the second electrical node and the third electrical node are arranged outside of a scribing line of the OELD so that they are electrically isolated therefrom after the motherboard is scribed.

18. The motherboard of an OELD according to claim 1, wherein the test signals initiate at least one of a lighting test, an aging test and a leakage current test.

* * * * *